United States Patent
Kumar et al.

(10) Patent No.: US 11,454,669 B2
(45) Date of Patent: Sep. 27, 2022

(54) CIRCUIT FOR DETECTING DAMAGE TO A PERIPHERAL EDGE ON AN INTEGRATED CIRCUIT DIE

(71) Applicants: STMicroelectronics International N.V., Schiphol (NL); STMicroelectronics (Crolles 2) SAS, Crolles (FR); STMicroelectronics (Grenoble 2) SAS, Grenoble (FR)

(72) Inventors: Manoj Kumar, Greater Noida (IN); Lionel Courau, Le Champ Pres Froges (FR); Geeta, Gurgaon (IN); Olivier Le-Briz, Saint-Gervais (FR)

(73) Assignees: STMicroelectronics International N.V., Schiphol (NL); STMicroelectronics (Crolles 2) SAS, Crolles (FR); STMicroelectronics (Grenoble 2) SAS, Grenoble (FR)

(*) Notice: Subject to any disclaimer, the term of this patent is extended or adjusted under 35 U.S.C. 154(b) by 317 days.

(21) Appl. No.: 16/680,114

(22) Filed: Nov. 11, 2019

(65) Prior Publication Data
US 2020/0150174 A1     May 14, 2020

Related U.S. Application Data

(60) Provisional application No. 62/760,214, filed on Nov. 13, 2018.

(51) Int. Cl.
*G01R 31/28*     (2006.01)
*H05K 1/02*     (2006.01)
*H01L 21/66*     (2006.01)
*H01L 23/525*     (2006.01)

(52) U.S. Cl.
CPC .......... *G01R 31/2884* (2013.01); *H01L 22/34* (2013.01); *H01L 23/525* (2013.01); *H05K 1/0254* (2013.01)

(58) Field of Classification Search
CPC ....... H01L 22/12; H01L 22/34; H01L 23/525; H05K 1/0254; G01R 31/318511; G01R 31/2884; G01R 31/2831; G01R 31/318505
See application file for complete search history.

(56) References Cited

U.S. PATENT DOCUMENTS

| | | |
|---|---|---|
| 6,686,750 B2 | 2/2004 | Watanabe et al. |
| 7,948,249 B2 | 5/2011 | Park |
| 8,803,308 B2 | 8/2014 | Ishikawa |
| 9,378,317 B2 | 6/2016 | Tschmelitsch et al. |

(Continued)

*Primary Examiner* — Jermele M Hollington
*Assistant Examiner* — Suresh K Rajaputra
(74) *Attorney, Agent, or Firm* — Crowe & Dunlevy

(57) ABSTRACT

An integrated circuit die has a peripheral edge and a seal ring extending along the peripheral edge and surrounding a functional integrated circuit area. A test logic circuit located within the functional integrated circuit area generates a serial input data signal for application to a first end of a sensing conductive wire line extending around the seal ring between the seal ring and the peripheral edge of the integrated circuit die. Propagation of the serial input data signal along the sensing conductive wire line produces a serial output data signal at a second end of the sensing conductive wire line. The test logic circuit compares data patterns of the serial input data signal and serial output data signal to detect damage at the peripheral edge of the integrated circuit die.

28 Claims, 3 Drawing Sheets

(56) References Cited

U.S. PATENT DOCUMENTS

| | | | |
|---|---|---|---|
| 9,646,897 B2 | 5/2017 | Sanchez et al. | |
| 9,793,220 B2 | 10/2017 | Barth et al. | |
| 2005/0151248 A1* | 7/2005 | Shau | G01R 31/2856 257/734 |
| 2006/0194353 A1 | 8/2006 | Spuhler et al. | |
| 2006/0194889 A1 | 8/2006 | Guo et al. | |
| 2007/0023915 A1 | 2/2007 | Jao et al. | |
| 2008/0012572 A1 | 1/2008 | Tsukuda | |
| 2016/0104683 A1* | 4/2016 | Lin | H01L 27/0288 257/532 |
| 2018/0145002 A1* | 5/2018 | Munder | G01R 31/2896 |

* cited by examiner

CIRCUIT FOR DETECTING DAMAGE TO A PERIPHERAL EDGE ON AN INTEGRATED CIRCUIT DIE

CROSS-REFERENCE TO RELATED APPLICATION

This application claims the priority benefit from U.S. Provisional Application for Patent No. 62/760,214 filed Nov. 13, 2018, the disclosure of which is incorporated herein by reference.

TECHNICAL FIELD

The present invention generally relates to circuitry for detecting damage to an integrated circuit die and, in particular, to the detection of cracks located at or near the edge of the integrated circuit die in the vicinity of the seal ring.

BACKGROUND

FIG. 1 shows a top view of a semiconductor wafer 10 after the completion of front end of line (FEOL), middle end of line (MEOL) and back end of line (BEOL) fabrication processing stages. The result of these fabrication processing stages is the formation of a plurality of integrated circuit die areas 12 arranged in a row by column array type format on the wafer 10. Each integrated circuit die area 12 includes a functional integrated circuit area (generally identified by reference 14 and comprising, for example, one or more of the following: processing circuits, memory circuits, logic circuits, analog circuits, digital circuits, etc.), metal interconnections (formed by interconnect lines and vias—not explicitly shown) and external die pads 16 (which are connected through the metal interconnections to the circuit devices of the functional integrated circuit area 14. The integrated circuit die areas 12 are delineated from each other on the wafer 10 by a scribe line (or lane) area 18 which surrounds each area 12. A sawing process is performed on the wafer 10 to cut along the middle of each scribe line area 18 in order to free a plurality of integrated circuit dies, which correspond to the plurality of integrated circuit die areas 12, from the wafer 10.

Those skilled in the art understand that the sawing process performed along the scribe line areas 18 when dicing the wafer 10 can produce chips and/or cracks in the material layers along the peripheral edge of the integrated circuit die. This damage may permit moisture or humidity to penetrate into the integrated circuit die and adversely affect, for example, the functional integrated circuit and/or metal interconnections. In addition, the mechanical stress induced by the sawing process can cause delamination of the material layers within the integrated circuit die. It is important for damaged integrated circuit dies to be discovered before die packaging is performed.

Reference is now made to FIG. 2 which shows in more detail a single integrated circuit die 30, corresponding to one of the integrated circuit die areas 12, after completion of the dicing operation. The functional integrated circuit area 14 is surrounded by a seal ring 32. As known in the art, the seal ring 32 typically comprises a plurality of patterned metal layers that are positioned on top of each other and interconnected by vias. The structure of the seal ring 32 is typically formed by a part of the BEOL processing stage. The seal ring 32 is positioned to extend just inside the peripheral edge of the integrated circuit die 30. The patterned metal layers with interconnecting vias of the seal ring 32 function to structurally reinforce the integrated circuit die 30 at the peripheral edge.

Notwithstanding the presence of the seal ring 32, the process for dicing the wafer 10 to release the integrated circuit dies 30 can produce damage in or near the seal ring. Over time this damage can lead to functional and/or performance failure of the integrated circuitry. Detection of this damage is an important part of quality control during integrated circuit fabrication processing. The most common method for damage detection is through a visual inspection process. There would be an advantage if a non-visual inspection means were available for detecting this damage.

SUMMARY

In an embodiment, a device comprises: an integrated circuit die having a peripheral edge; a seal ring extending along the peripheral edge and surrounding a functional integrated circuit area, wherein the functional integrated circuit area includes a core integrated circuit area powered by a first power supply domain and an input/output (I/O) integrated circuit area powered by a second power supply domain different from the first power supply domain; a test logic circuit located within the core integrated circuit area and powered by the first power supply domain; a transmit/receive (Tx/Rx) interface circuit located within the I/O integrated circuit area but also powered by the first power supply domain, the Tx/Rx interface circuit coupled to the test logic circuit by a communications bus; and a sensing conductive wire line having a first end connected to an output of the Tx/Rx interface circuit and a second end connected to an input of the Tx/Rx interface circuit, said sensing conductive wire line extending to surround the seal ring between the seal ring and the peripheral edge of the integrated circuit die.

In an embodiment, a device comprises: an integrated circuit die having a peripheral edge; a seal ring extending along the peripheral edge and surrounding a functional integrated circuit area; a test logic circuit located within the functional integrated circuit area; a transmit/receive (Tx/Rx) interface circuit located within the functional integrated circuit area and coupled to the test logic circuit by a communications bus; and a sensing conductive wire line having a first end connected to an output of the Tx/Rx interface circuit and a second end connected to an input of the Tx/Rx interface circuit, said sensing conductive wire line extending to surround the seal ring between the seal ring and the peripheral edge of the integrated circuit die.

In an embodiment, a device comprises: an integrated circuit die having a peripheral edge; a seal ring extending along the peripheral edge and surrounding a functional integrated circuit area; a test logic circuit located within the functional integrated circuit area; a transmit/receive (Tx/Rx) interface located within the functional integrated circuit area and coupled to the test logic circuit by a communications bus; a sensing conductive wire line having a first end connected to an output of the Tx/Rx interface circuit and a second end connected to an input of the Tx/Rx interface circuit, said sensing conductive wire line extending to surround the seal ring between the seal ring and the peripheral edge of the integrated circuit die; and a bypass circuit comprising a switched bypass path configured to selectively bypass the sensing conductive wire line in response to assertion of a bypass control signal generated by the test logic circuit.

BRIEF DESCRIPTION OF THE DRAWINGS

For a better understanding of the embodiments, reference will now be made by way of example only to the accompanying figures in which.

DETAILED DESCRIPTION

Figure 1:
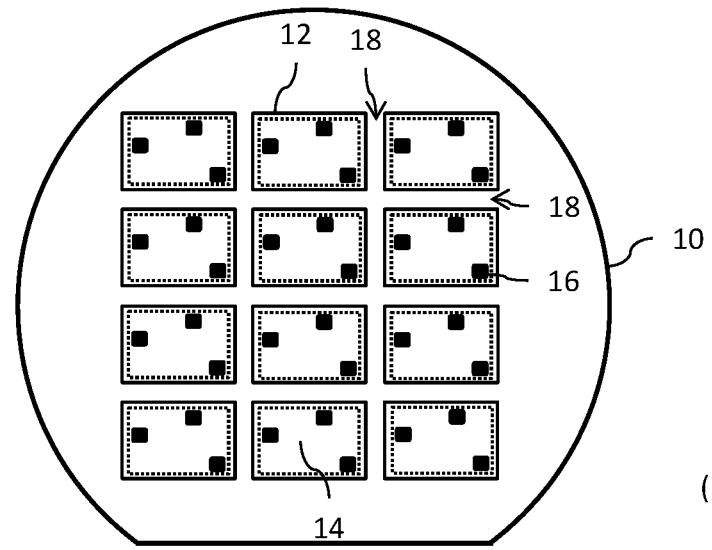
FIG. 1 shows a top view of a semiconductor wafer.
Figure 2:
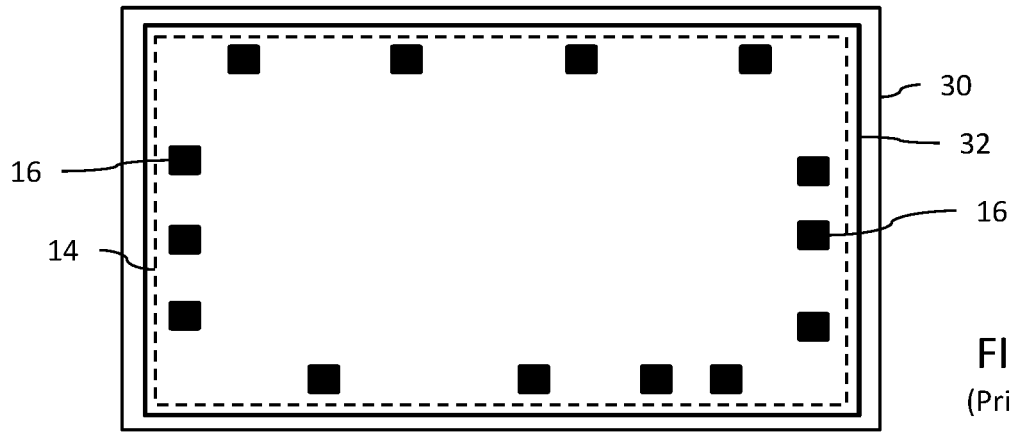
FIG. 2 shows a top view of an integrated circuit die diced from the wafer of FIG. 1.
Figure 3:
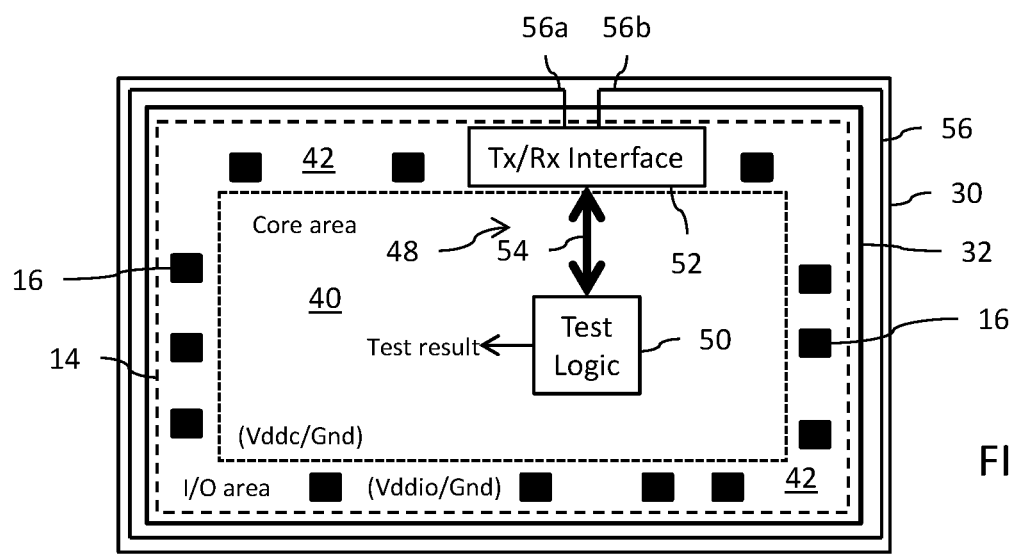
FIG. 3 shows a top view of an integrated circuit die that includes a damage detection circuit.

Reference is now made to FIG. 3 which shows a top view of an integrated circuit die 30 that includes a damage detection circuit 48. The functional integrated circuit area 14 includes a core integrated circuit area 40 and an input/output (I/O) integrated circuit area 42. The core integrated circuit area 40 includes the circuitry which is designed to perform the primary functional operations of the integrated circuit (this would include, for example, processing circuits, memory circuits, power generation and/or management circuits, clock generation circuits, analog and/or digital operation circuits, etc.). The I/O integrated circuit area 42 includes the circuitry which is designed to handle the inputting of signals to, and the outputting of signals from, the circuitry of the core integrated circuit area 40 (this would include, for example, driver circuits, level shifting circuits, electrostatic discharge (ESD) protection circuits, power routing circuits, etc.). In the illustrated example, the I/O integrated circuit area 42 occupies a ring-shaped area which peripherally surrounds the core integrated circuit area 40. The external die pads 16 are typically electrically connected to circuits of I/O integrated circuit area 42 and thus are located within the I/O integrated circuit area 42.

It is common for the core integrated circuit area 40 and the I/O integrated circuit area 42 to be powered from distinct power supply domains. The positive power supply node for the core integrated circuit area 40 may be at a voltage Vddc while the positive power supply node for the I/O integrated circuit area 42 may be at a voltage Vddio, with Vddc<Vddio (for example, Vddc=1.6V or less and Vddio=3.3V or 5V). The core integrated circuit area 40 and I/O integrated circuit area 42 may share a common ground node or alternatively have separate ground nodes. Some external die pads 16 may be dedicated for use with the power supply domains. The remaining external die pads 16 are typically used for making signal connections.

The damage detection circuit 48 includes a test logic circuit 50 located within the core integrated circuit area 40 and powered from the core power domain (Vddc/Gnd). The test logic circuit 50 may be embedded in Register-Transfer Level (RTL) integration as is well known to those skilled in the art, and may comprise a portion of a built-in self-test (BIST) for the integrated circuit die. The test logic circuit 50 functions to generate testing and control signals, receive test sensing signals, perform processing to make determinations as to whether damage has been detected, and output test result signals. In particular, the test logic circuit 50 functions in connection with the damage detection circuit 48 to test for whether the integrated circuit die has been damaged as a result of the performance of the wafer dicing operation. In particular, the testing performed detects whether damage due to a crack or chip at the peripheral edge is so severe as to require the integrated circuit die to be discarded as defective.

The damage detection circuit 48 further includes a transmit/receive (Tx/Rx) interface circuit 52. In a preferred implementation, the Tx/Rx interface circuit 52 is located within the I/O integrated circuit area 42. However, notwithstanding its location in the I/O integrated circuit area 42, where the I/O circuitry is powered from the I/O power domain (Vccio/Gnd), the Tx/Rx interface circuit 52 is powered from the core power domain (Vddc/Gnd) in common with the test logic circuit 50. In an alternative implementation, the Tx/Rx interface circuit 52 may be located within the core integrated circuit area 40 and be powered from the core power domain (Vddc/Gnd). A communications bus 54 interconnects the test logic circuit 50 to the Tx/Rx interface circuit 52 and carries the testing signal(s), control signal(s) and test sensing signal(s).

The damage detection circuit 48 still further includes a sensing conductive wire line 56 having a first end 56a connected to an output of the Tx/Rx interface circuit 52 and a second end 56b connected to an input of the Tx/Rx interface circuit 52. The sensing wire line 56 extends from the first end 56a to the second end 56b and is located adjacent to the peripheral edge of the integrated circuit die 30 near to, but not within, where the scribe line area is located. In a preferred implementation, the sensing wire line 56 is located between the seal ring 32 and the peripheral edge of the integrated circuit die 30. The sensing wire line 56 is formed by at least one patterned metal layer as part of the BEOL processing stage.

Figure 4:
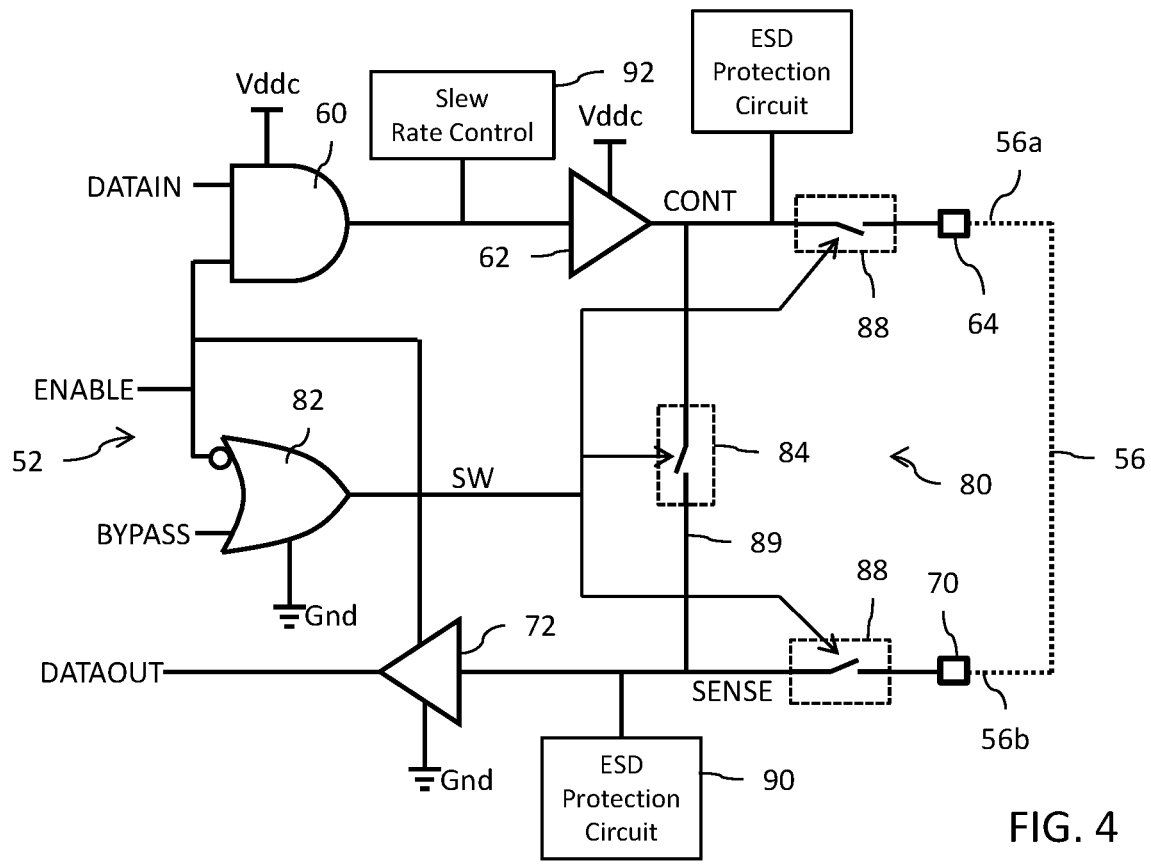
FIG. 4 is a circuit diagram of the transmit/receive interface circuit for the damage detection circuit of FIG. 3.

Reference is now made to FIG. 4 which shows a circuit diagram for an embodiment of the Tx/Rx interface circuit 52. As noted above, the circuitry within the Tx/Rx interface circuit 52 is preferably powered from the core power domain (Vddc/Gnd). Representative power connections, but not all power connections, to the core power domain (Vddc/Gnd) are shown in FIG. 4. A serial input data signal DATAIN is received over communications bus 54 from the test logic circuit 50 at a first input of a logical AND gate 60. The serial input data signal DATAIN comprises a transmitted sequence of plural data bits that are generated by the test logic circuit 50 in order to test continuity and conductivity of the sensing wire line 56. In an embodiment, the serial input data signal DATAIN may comprise an 8-bit, 16-bit, 32-bit, 64-bit, or the like, serial data signal having a specific testing pattern of logic high and logic low bits. A second input of the AND gate 60 receives an enable signal ENABLE that is also received over communications bus 54 from the test logic circuit 50. When the enable signal ENABLE is logic high, the AND gate 60 passes the serial input data signal DATAIN to the output of the AND gate 60. The serial input data signal DATAIN is applied to the input of a transmit driver circuit 62 which outputs a serial data continuity test signal CONT at output node 64 that is connected to the first end 56a of the sensing wire line 56. The serial data continuity test signal CONT propagates through the sensing wire line 56. The second end 56b of the sensing wire line 56 is connected to input node 70 to supply a serial data sense signal SENSE in response to the propagation of the serial data continuity test signal CONT. The serial data sense signal SENSE is applied to the input of a receive driver circuit 72 which outputs a serial output data signal DATAOUT over communications bus 54 to the test logic circuit 50. The operation of the receive driver circuit 72 is enabled when the enable signal ENABLE is logic high.

The test logic circuit 50 processes the serial output data signal DATAOUT to recover a sequence of plural data bits. In the absence of damage and/or defect in the sensing wire line 56, the recovered sequence of plural data bits should match the transmitted sequence of plural data bits with some degree of accuracy (for example, exactly matching or having a bit error rate less than some specified threshold). In such a case, the testing performed using the damage detection circuit 48 would indicate that the dicing operation performed to free the integrated circuit die 30 from the wafer 10 did not produce significant damage. However, in the case where test logic circuit 50 determines that an error exists between the recovered sequence of plural data bits and the transmitted sequence of plural data bits, this would indicate that the dicing operation performed to free the integrated circuit die 30 from the wafer 10 produced some significant damage to die which adversely affected the continuity and/or conductivity of the sensing wire line 56. The test logic circuit 50 can then generate an appropriate test result signal output (for example, by setting a register flag or outputting data to a test pin/pad) to indicate that the integrate circuit die failed the damage detection test. Further investigation of the die, for example, using a visual inspection, can then be performed. Alternatively, the setting of the flag for the test result signal output can be used to trigger discarding of the integrated circuit die (for example in connection with a wafer sort process as known in the art).

Although the serial data signal for the signal DATAIN is preferred, it will be understood that in some implementations the signal DATAIN may instead comprise just an assertion of the input to the AND gate 60 in a logic high state (for example, at the Vddc voltage). In the case where there is no damage to the line 56, the signal SENSE will likewise be at the logic high state and this condition can be detected by the test logic circuit 50 through the signal DATAOUT. However, there is an advantage to using the serial data signal for the signal DATAIN. Simple use of the logic high state for the signal DATAIN is well suited to detection of a severing of the line 56. It is possible that some other type of damage may exist to the line which would not be detected when the signal DATAIN is formed just by an assertion to the logic high state. For example, the damage to the line 56 may adversely affect resistance and in such a case the use of the serial data signal for the signal DATAIN will better be able to detect the damage due to a detection of a signal delay with respect to the signal SENSE.

The Tx/Rx interface circuit 52 further includes a bypass circuit 80. A logical OR gate 82 has a first input that receives a logical invert of the enable signal ENABLE. A second input of the OR gate 82 receives a bypass signal BYPASS that is received over communications bus 54 from the test logic circuit 50. When the enable signal ENABLE is logic high, the output of the OR gate 82 follows the logic state of the bypass signal BYPASS. Conversely, when the enable signal ENABLE is logic low, the output of the OR gate 82 is always logic high. The bypass circuit 80 includes a first switching circuit 84, a second switching circuit 86 and a third switching circuit 88, and the switching states of these switching circuits is controlled by the logic state of a switch control signal SW output from the OR gate 82. The first switching circuit 84, second switching circuit 86 and third switching circuit 88 of the bypass circuit 80 may be implemented using MOSFET devices.

The first switching circuit 84 selectively connects the output of the transmit driver circuit 62 to the input of the receive driver circuit 72 in response to the logic state of the switch control signal SW. More specifically, if the switch control signal SW is logic high, then the first switching circuit 84 is closed; and conversely if the switch control signal SW is logic low, then the first switching circuit 84 is open.

The second switching circuit 86 selectively connects the output of the transmit driver circuit 62 to the output node 64 of the Tx/Rx interface circuit 52 in response to the logic state of the switch control signal SW. More specifically, if the switch control signal SW is logic high, then the second switching circuit 86 is open; and conversely if the switch control signal SW is logic low, then the second switching circuit 86 is closed.

The third switching circuit 88 selectively connects the input node 70 of the Tx/Rx interface circuit 52 to the input of the receive driver circuit 72 in response to the logic state of the switch control signal SW. More specifically, if the switch control signal SW is logic high, then the third switching circuit 88 is open; and conversely if the switch control signal SW is logic low, then the third switching circuit 88 is closed.

In a normal (i.e., damage testing) mode of operation for the Tx/Rx interface circuit 52, the bypass signal BYPASS is logic low and the first switching circuit 84, second switching circuit 86 and third switching circuit 88 of the bypass circuit 80 are configured by the switch control signal SW in the open, closed and closed states, respectively. In this configuration, the serial input data signal DATAIN received over communications bus 54 from the test logic circuit 50 is applied by the transmit driver circuit 62 as the continuity test signal CONT to the first end 56a of the sensing wire line 56 at output node 64. The continuity test signal CONT propagates through the sensing wire line 56 to produce the sense signal SENSE at input node 70. The sense signal SENSE is received by the driver circuit 72 which outputs the serial output data signal DATAOUT over communications bus 54 to the test logic circuit 50. In this mode, as discussed above, the data signal DATAOUT provides information concerning the conductivity and/or continuity of (e.g., damage to) the sensing wire line 56.

In a bypass mode of operation for the Tx/Rx interface circuit 52, the bypass signal BYPASS is logic high and the first switching circuit 84, second switching circuit 86 and third switching circuit 88 of the bypass circuit 80 are configured by the switch control signal SW in the closed, open and open states, respectively. In this configuration, the serial input data signal DATAIN received over communications bus 54 from the test logic circuit 50 is applied by the transmit driver circuit 62 as the continuity test signal CONT to the bypass path 89 through the closed first switching circuit 84 to produce the sense signal SENSE. The opening of the second switching circuit 86 and third switching circuit 88 of the bypass circuit 80 effectively bypasses the sensing wire line 56. The sense signal SENSE is received by the driver circuit 72 which outputs the serial output data signal DATAOUT over communications bus 54 to the test logic circuit 50. In this mode, the data signal DATAOUT provides information concerning the proper operation of the logic gates and driver circuits of the Tx/Rx interface circuit 52. In the event that an error exists between the recovered sequence of plural data bits and the transmitted sequence of plural data bits, this would indicate that the Tx/Rx interface circuit 52 itself is not operating properly.

The bypass mode of operation for the Tx/Rx interface circuit 52 is implemented as a part of a design for testing (DFT) mode for the integrated circuit die 30. Through this mode, the integrated circuit die 30 can function to test itself for damage.

Advantageously, when the bypass mode of operation for the Tx/Rx interface circuit 52 is actuated with both the second switching circuit 86 and third switching circuit 88 of the bypass circuit 80 in an open state, the damage detection circuit 48 is completely isolated from the sensing wire line 56.

In a preferred implementation, the transistors used within the logic gates, switches and driver circuits of the Tx/Rx interface circuit 52 may comprise metal oxide semiconductor field effect transistor (MOSFET) devices having relatively think gate oxides. For example, the transistors may have gate oxides with thicknesses that are of the same thickness as the gate oxides for the transistors within the I/O integrated circuit area 42, with these gate oxide thicknesses being greater than the gate oxide thickness for the transistors within the core integrated circuit area 40. The advantage of this is to provide an enhanced level of protection for the Tx/Rx interface circuit 52 against damage from transient voltage events.

Additional protection against transient voltage events is provided by an electrostatic discharge (ESD) circuit 90 that is connected at the input of the receive driver circuit 72. The specific details of the circuit are not provided as any suitable protection circuit (for example, of the type which utilizes a protection diode or a grounded-gate n-channel MOSFET (GGNMOS) device) could be used. It will also be understood that ESD protection (using such an ESD protection circuit 90) can be provided at the output of the driver circuit 62.

As previously noted, the Tx/Rx interface circuit 52 is powered from the core power domain (Vddc/Gnd), not the I/O power domain (Vccio/Gnd). The advantage of this power configuration is that the Tx/Rx interface circuit 52 is more easily integrated with the circuitry within the core integrated circuit area 40. There is no need for the inclusion of any circuitry for interfacing between different power domains (such as, for example, level shifting circuits).

The transmit driver circuit 62 is implemented with a slew rate control circuit 92 which controls the slew rate of the serial input data test signal DATAIN at the input (i.e., gate terminal) of the transmit driver circuit 62. As an example, the slew rate control circuit 92 functions to control the transition times of the driver 62. This is done to ensure that the transition of the signal output from the driver 62 generates little (preferably no) noise in the line 56. The slew rate control circuit 92 can be implemented with any suitable circuit that performs the transition time control function. Circuits with a MOSFET device or a resistor/capacitor of combination of the foregoing may be used by the slew rate control circuit 92. In operation, the slew rate control circuit 92 will control the gate terminal of the driver transistors of the transmit driver circuit 62 so as to avoid a high peak value of driver transistor output current, and with that control the output transmission time (slew rate).

It will be noted that the sensing wire line 56 is essentially a metal loop which resembles an antenna (inductor). It is important that the transmit driver circuit 62 not induce a voltage on the sensing wire line. Because the sensing wire line 56 is basically a wire loop, in a radio frequency kind of application for the integrated circuit 30 the line 56 can represent an antenna and can affect the RF (high speed) performance. So, it is important for the transmit driver circuit 62 to function in a manner where little to no injection is made of noise or high transition time signals to avoid any RF noise generation.

Because of the length of the sensing wire line 56, the capacitance of the sensing wire line 56 cannot be ignored. There is a possibility for noise to couple onto the sensing wire line 56, and this noise can adversely affect the signal-to-noise ratio of the sense signal SENSE. To address this concern, the receive driver circuit 72 should preferably have a relatively high noise immunity. As an example only, a Schmitt trigger type of circuit could be used for the receive driver circuit 72.

Figure 5:
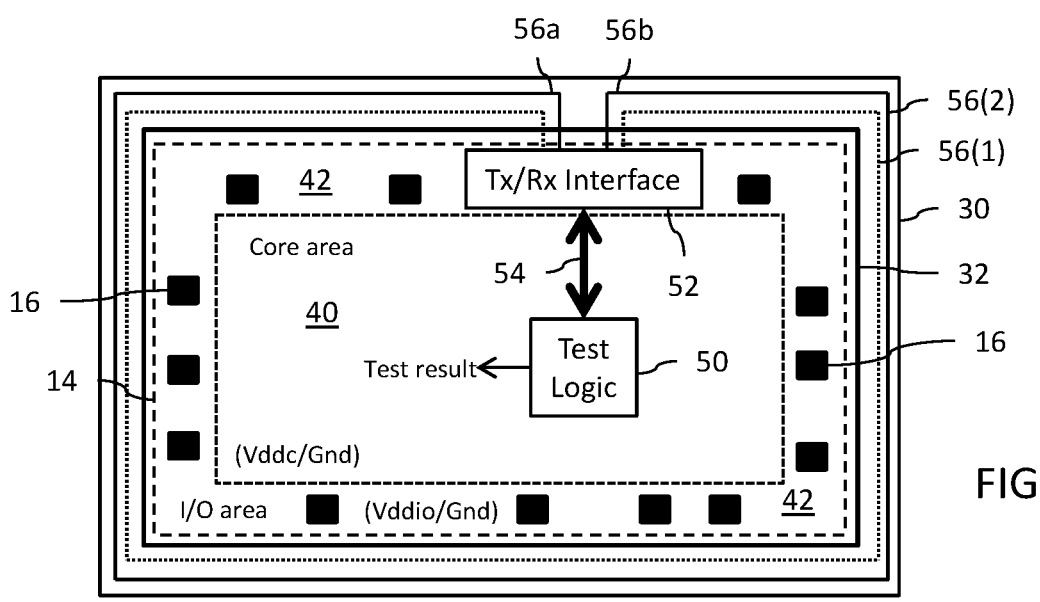
FIG. 5 shows a top view of an integrated circuit die that includes a damage detection circuit using two sensing lines.
Figure 6:
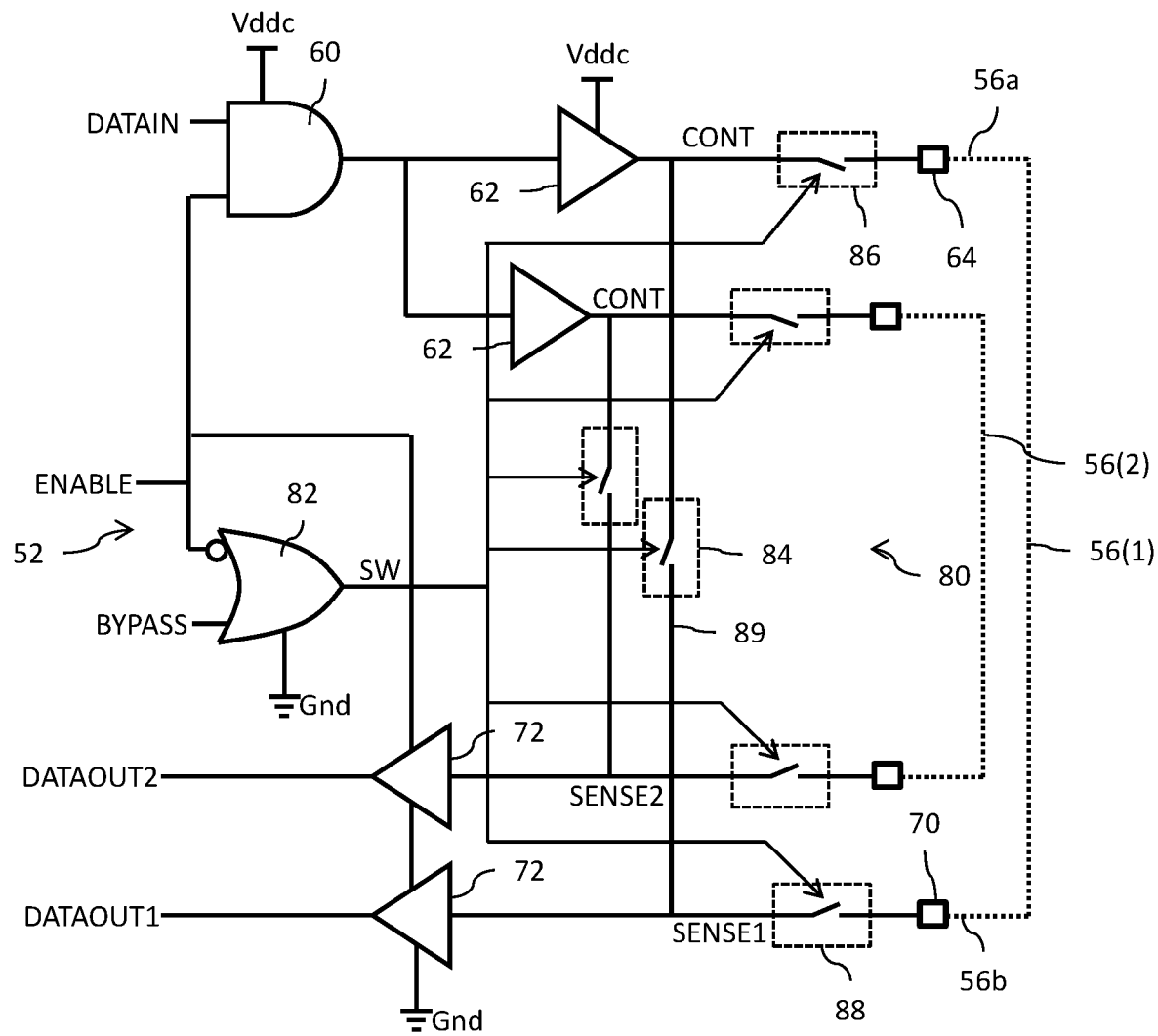
FIG. 6 is a circuit diagram of the transmit/receive interface circuit for the damage detection circuit of FIG. 5.

Although FIGS. 3 and 4 illustrate a damage detection circuit 48 that includes only one sensing wire line 56, it will be understood that this is only an example and that two or more sensing wire lines 56 could instead be used for damage detection. In a scenario where two sensing wire lines 56(1) and 56(2) are present as shown in FIGS. 5 and 6, both could be located between the seal ring 32 and the peripheral edge of the integrated circuit die 30. Alternatively, one sensing wire line 56 could be located inside of the seal ring 32 and another sensing wire line 56 could be located outside of the seal ring. With the presence of additional sensing wire lines 56, the circuitry including the drivers 62 and 72, switches 82, 84 and 86 and bypass path 88 used for the first sensing wire line 56(1) is simply replicated for the second sensing wire line 56(2). Operation of the circuits in response to the ENABLE and BYPASS signals is the same. The difference is that multiple serial output data output signals (DATAOUT1 and DATAOUT2) are generated for evaluation by the test logic circuit 50 in making the damage detection determination.

Although the sensing wire line 56 is illustrated as being separate from the seal ring 32, this is a matter of choice in the design. In an embodiment, the sensing wire line 56 may be a component part of (i.e., additionally function as) the seal ring 32. In the context of the FIG. 6 implementation with two sensing wire lines 56(1) and 56(2), these lines are electrically insulated from each other but physically together may form all or part of the seal ring 32.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A device, comprising:
an integrated circuit die having a peripheral edge;
a seal ring extending along the peripheral edge and surrounding a functional integrated circuit area, wherein the functional integrated circuit area includes a core integrated circuit area powered by a first power supply domain and an input/output (I/O) integrated circuit area powered by a second power supply domain different from the first power supply domain;
a test logic circuit located within the core integrated circuit area and powered by the first power supply domain;
a transmit/receive (Tx/Rx) interface circuit located within the I/O integrated circuit area but also powered by the first power supply domain, the Tx/Rx interface circuit coupled to the test logic circuit by a communications bus; and a sensing conductive wire line having a first end connected to an output of the Tx/Rx interface circuit and a second end connected to an input of the Tx/Rx interface circuit, said sensing conductive wire line extending to surround the seal ring between the seal ring and the peripheral edge of the integrated circuit die;

wherein the test logic circuit generates a multibit serial input data signal that is transmitted over the communications bus and interfaced by the Tx/Rx interface circuit for application at the output of the Tx/Rx interface circuit to the first end of the sensing conductive wire line, wherein propagation of the multibit serial input data signal over the sensing conductive wire line produces a sense signal at the input of the Tx/Rx interface circuit, said Tx/Rx interface circuit interfacing the sense signal to generate a multibit serial output data signal for transmission over the communications bus to the test logic circuit.

2. The device of claim 1, wherein the test logic circuit is configured to compare a data pattern of the multibit serial input data signal to a data pattern of the multibit serial output data signal and generate a test result signal in response to the comparison.

3. The device of claim 2, wherein a logic state of the test result signal is indicative of detection of damage at the peripheral edge of the integrated circuit die.

4. The device of claim 1, wherein the Tx/Rx interface circuit comprises:
   a transmit driver circuit having an input coupled to receive the multibit serial input data signal and an output coupled to apply the multibit serial input data signal to the first end of the sensing conductive wire line; and
   a receive driver circuit having an input coupled to the second end of the sensing conductive wire line and an output coupled to apply the multibit serial output data signal to the communications bus.

5. The device of claim 4, further comprising an enable circuit configured to receive an enable signal and in response thereto pass the multibit serial input data signal to the input of the transmit driver circuit and enable operation of the receive driver circuit.

6. The device of claim 4, further comprising a bypass circuit comprising:
   a switched bypass path selectively coupling the output of transmit driver circuit to the input of the receive driver circuit, said switched bypass path actuated in response to assertion of a bypass control signal generated by the test logic circuit.

7. The device of claim 6, wherein the bypass circuit further comprises:
   a switching circuit configured to disconnect the output of the transmit driver circuit from the first end of the sensing conductive wire line in response to assertion of the bypass control signal.

8. The device of claim 6, wherein the bypass circuit further comprises:
   a switching circuit configured to disconnect the second end of the sensing conductive wire line from the input of the receive driver circuit in response to assertion of the bypass control signal.

9. The device of claim 4, further comprising a slew rate control circuit connected to the input of the transmit driver circuit.

10. The device of claim 4, further comprising an electrostatic discharge (ESD) protection circuit connected to at least one of the input of the receive driver circuit and the output of the transmit driver circuit.

11. The device of claim 1, wherein the sensing conductive wire line forms at least part of the seal ring.

12. A device, comprising:
   an integrated circuit die having a peripheral edge;
   a seal ring extending along the peripheral edge and surrounding a functional integrated circuit area;
   a test logic circuit located within the functional integrated circuit area;
   a transmit/receive (Tx/Rx) interface circuit located within the functional integrated circuit area and coupled to the test logic circuit by a communications bus; and
   a sensing conductive wire line having a first end connected to an output of the Tx/Rx interface circuit and a second end connected to an input of the Tx/Rx interface circuit, said sensing conductive wire line extending to surround the seal ring between the seal ring and the peripheral edge of the integrated circuit die;

wherein the test logic circuit generates a multibit serial input data signal that is transmitted over the communications bus and interfaced by the Tx/Rx interface circuit for application at the output of the Tx/Rx interface circuit to the first end of the sensing conductive wire line, wherein propagation of the multibit serial input data signal over the sensing conductive wire line produces a sense signal at the input of the Tx/Rx interface circuit, said Tx/Rx interface circuit interfacing the sense signal to generate a multibit serial output data signal for transmission over the communications bus to the test logic circuit.

13. The device of claim 12, wherein the test logic circuit is configured to compare a data pattern of the multibit serial input data signal to a data pattern of the multibit serial output data signal and generate a test result signal in response to the comparison.

14. The device of claim 13, wherein a logic state of the test result signal is indicative of detection of damage at the peripheral edge of the integrated circuit die.

15. The device of claim 12, wherein the Tx/Rx interface circuit comprises:
   a transmit driver circuit having an input coupled to receive said multibit serial input data signal from the test logic circuit and an output coupled to apply said multibit serial input data signal to the first end of the sensing conductive wire line; and
   a receive driver circuit having an input coupled to the second end of the sensing conductive wire line to receive said sense signal and an output coupled to transmit said multibit serial output data signal to the test logic circuit.

16. The device of claim 15, further comprising a bypass circuit comprising:
   a switched bypass path selectively coupling the output of transmit driver circuit to the input of the receive driver circuit, said switched bypass path actuated in response to assertion of a bypass control signal generated by the test logic circuit.

17. The device of claim 15, wherein the bypass circuit further comprises:
   a first switching circuit configured to disconnect the output of the transmit driver circuit from the first end of the sensing conductive wire line in response to assertion of the bypass control signal; and
   a second switching circuit configured to disconnect the second end of the sensing conductive wire line from the input of the receive driver circuit in response to assertion of the bypass control signal.

18. The device of claim 12, wherein the sensing conductive wire line forms at least part of the seal ring.

19. The device of claim 12, wherein the test logic circuit and the Tx/Rx interface circuit are powered from a same power supply domain.

20. A device, comprising:
an integrated circuit die having a peripheral edge;
a seal ring extending along the peripheral edge and surrounding a functional integrated circuit area;
a test logic circuit located within the functional integrated circuit area;
a transmit/receive (Tx/Rx) interface located within the functional integrated circuit area and coupled to the test logic circuit by a communications bus;
a sensing conductive wire line having a first end connected to an output of the Tx/Rx interface circuit to receive a test signal and a second end connected to an input of the Tx/Rx interface circuit to provide a sense signal, said sensing conductive wire line extending to surround the seal ring between the seal ring and the peripheral edge of the integrated circuit die; and
a bypass circuit comprising a switched bypass path configured to selectively bypass the sensing conductive wire line in response to assertion of a bypass control signal generated by the test logic circuit so that the test signal at the output of the Tx/Rx interface circuit is applied to the input of the Tx/Rx interface circuit without passing through the sensing conductive wire line.

21. The device of claim 20, wherein the Tx/Rx interface circuit comprises:
a transmit driver circuit having an input coupled to receive an input signal from the test logic circuit and an output coupled to apply a test signal to the first end of the sensing conductive wire line; and
a receive driver circuit having an input coupled to the second end of the sensing conductive wire line to receive a sense signal and an output coupled to transmit an output signal to the test logic circuit.

22. The device of claim 20, wherein the switched bypass path selectively couples the output of transmit driver circuit to the input of the receive driver circuit when the bypass control signal is asserted by the test logic circuit.

23. The device of claim 22, wherein the bypass circuit further comprises:
a switching circuit configured to disconnect the output of the transmit driver circuit from the first end of the sensing conductive wire line in response to assertion of the bypass control signal.

24. The device of claim 22, wherein the bypass circuit further comprises:
a switching circuit configured to disconnect the second end of the sensing conductive wire line from the input of the receive driver circuit in response to assertion of the bypass control signal.

25. The device of claim 20, wherein the test logic circuit generates a multibit serial input data signal that is transmitted over the communications bus and interfaced by the Tx/Rx interface circuit for application at the output of the Tx/Rx interface circuit to the first end of the sensing conductive wire line when the bypass control signal is deasserted, wherein propagation of the multibit serial input data signal over the sensing conductive wire line produces a sense signal at the input of the Tx/Rx interface circuit, said Tx/Rx interface circuit interfacing the sense signal to generate a multibit serial output data signal for transmission over the communications bus to the test logic circuit.

26. The device of claim 25, wherein the test logic circuit is configured to compare a data pattern of the multibit serial input data signal to a data pattern of the multibit serial output data signal and generate a test result signal in response to the comparison.

27. The device of claim 26, wherein a logic state of the test result signal is indicative of detection of damage at the peripheral edge of the integrated circuit die.

28. The device of claim 20, wherein the sensing conductive wire line forms at least part of the seal ring.

* * * * *